(12) United States Patent
Patel et al.

(10) Patent No.: US 6,480,528 B1
(45) Date of Patent: Nov. 12, 2002

(54) AUTOMATIC GAIN CONTROL FOR IMPROVED DECODING OF MULTI-CARRIER SIGNAL

(75) Inventors: Shimman Patel, San Diego, CA (US); Thomas Wilborn, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/330,440

(22) Filed: Jun. 11, 1999

(51) Int. Cl.[7] .............................................. H04B 1/707
(52) U.S. Cl. ....................... 375/148; 375/152; 375/345; 375/260
(58) Field of Search ................................ 375/147, 148, 375/152, 260, 343, 345; 370/320, 335, 342, 441

(56) References Cited

U.S. PATENT DOCUMENTS

| | | | |
|---|---|---|---|
| 4,710,772 A | * 12/1987 | Cantwell et al. | 342/92 |
| 4,775,988 A | * 10/1988 | Chevillat et al. | 375/345 |
| 5,659,546 A | 8/1997 | Elder | 370/343 |
| 5,844,512 A | 12/1998 | Gorin et al. | 341/139 |
| 6,278,746 B1 | * 8/2001 | Velez et al. | 375/326 |

OTHER PUBLICATIONS

T. Haynes, "DSP Technology Optimizes Multi–channel Digital Receivers" Apr. 1997, RF Receivers, vol. 20, No. 4, pps. 58–62.

* cited by examiner

*Primary Examiner*—Don N. Vo
(74) *Attorney, Agent, or Firm*—Philip R. Wadsworth; Charles D. Brown; George C. Pappas

(57) ABSTRACT

A method and a receiver for processing a desired signal for decoding (i.e., by a decoder). In accordance with the method, an input signal that includes the desired signal and additional signals is received and filtered with a first filter having a bandwidth greater than a bandwidth of the desired signal. The filtered signal is then sampled to generate discrete time samples, which is then filtered with a discrete time matched filter. The filtered samples are then scaled with a scaling factor and quantized. A quantity related to an amplitude of the quantized samples (i.e., power) is measured, and the scaling factor is adjusted in accordance with the measured quantity. The quantized samples can be further processed (i.e., demodulated) and provided to a decoder. The desired signal can be a quadrature modulated signal, in which case matched filtering, scaling, and quantization are performed on the in-phase and quadrature components of the desired signal. The adjustment of the scaling factor can be performed by an automatic gain control (AGC) loop that compares the measured quantity (e.g., signal power of the quantized samples) against a predetermined value to generate error values. The AGC loop then filters the error values to generate the scaling factor. In an embodiment, the loop filtering can be performed with an integrator.

30 Claims, 5 Drawing Sheets

AUTOMATIC GAIN CONTROL FOR IMPROVED DECODING OF MULTI-CARRIER SIGNAL

BACKGROUND OF THE INVENTION

The present invention relates to communications, and more particularly to techniques that provide for improved decoding performance of a multi-carrier signal.

Digital communication is widely used for many applications including digital video, cellular telephones, and other. Examples of digital communications systems for use in cellular phones include time division multiple access (TDMA), frequency division multiple access (FDMA), and code division multiple access (CDMA) communications systems. These multiple access systems support simultaneous transmission of multiple channels, which are allocated to users on demand and as available.

CDMA utilizes spread spectrum techniques that offer significant advantages over other modulation techniques used by other multiple access communication systems. In CDMA systems, data for each communications channel (i.e., assigned to a particular user) is coded and spread across the entire frequency band. The inherent wideband nature of the CDMA signal offers frequency diversity such that selective fading affects only a portion of the CDMA signal bandwidth. Space or path diversity is achieved by providing multiple signal paths through simultaneous transmission from two or more base stations to a mobile unit. Further, path diversity may be obtained by exploiting the multipath environment through spread spectrum processing in which signals arriving with different propagation delays are separately received and processed and later combined.

CDMA systems are typically designed to conform to the "TIA/EIA/IS-95-A Mobile Station-Base Station Compatibility Standard for Dual-Mode Wideband Spread Spectrum Cellular System," hereinafter referred to has the IS-95-A standard. This standard defines the number of channels available for each CDMA signal and the CDMA signal bandwidth. For example, a CDMA signal conforming to the IS-95-A standard (i.e., a "standard" CDMA signal) includes up to 64 orthogonal Walsh channels and has a bandwidth of 1.2288 MHz.

To achieve greater data transmission capability, a wideband CDMA signal or multiple standard CDMA signals can be used. One such signal is a multi-carrier (MC) signal that is defined by "TR-45 Physical Layer Standard for CDMA 2000 Spread Spectrum Systems," referred to as the IS-95-C standard and incorporated herein by reference. The multi-carrier signal includes three standard CDMA signals to provide up to three times the data transmission capability of the standard CDMA signal.

The CDMA signal is encoded and modulated for transmission in a noisy transmission environment. In accordance with IS-95-A standard, the modulation includes "covering" each communications channel with a unique Walsh code corresponding to that channel and "spreading" the covered channel with a pseudo-noise (PN) sequence unique to the particular transmitting base station. Walsh covering provides orthogonality between the channels, and PN spreading spreads the covered channels over the entire CDMA signal bandwidth. Thus, each CDMA signal is a combination of many individually covered and spread channels (e.g., up to 64 for IS-95-A systems).

The CDMA signal is received and processed by a receiver. In many receiver designs, the received RF signal is conditioned and filtered by analog circuitry, sampled and quantized by an analog-to-digital converter (ADC). The received RF signal includes the desired signal (e.g., one or more CDMA signals) along with the undesired signals. Typically, one or more stages of filtering are provided to remove the undesired signals. One of the filter stages is typically an analog filter having a bandwidth matched to the bandwidth of the signal being demodulated (e.g., approximately 1.26 MHz for one IS-95-A compliant CDMA signal).

Matched filtering is conventionally performed to remove an optimum (or near optimum) amount of noise from the received signal before sampling and quantizing by the ADC. Typically, the amplitude of the signal provided to the ADC input (i.e., the desired signal plus noise) is maintained such that the ADC introduces a minimum (or near minimum) amount of saturation plus quantization noise. Filtering by a filter having an excessive bandwidth results in the inclusion of more noise than optimal. The additional noise may require a larger dynamic range ADC to reach the same saturation plus quantization noise. Conversely, filtering by a filter having a narrow bandwidth results in the removal of more desired signals than optimal.

There are several reasons why it may not be practical to perform matched filtering before sampling by the ADC. For example, the input signal may contain a number of modulated signals, and it may be desirable to sample all modulated signals using the minimum number of ADCs (i.e., to reduce cost and circuit complexity). As another example, the input signal may have a variable bandwidth (i.e., for a variable data rate system) and it may be more efficient to utilize a filter having a bandwidth matched to the largest bandwidth. For each of these examples, multiple analog matched filters can be used for each signal bandwidth of interest. However, this "brute force" approach increases circuit complexity and cost.

In accordance with the IS-95-A standard, convolutional encoding is used to provide error-correcting capability of the received data bits. At the receiver, after filtering by a matched filter, sampling and quantization by an ADC, and demodulation by a demodulator, the demodulated data samples are provided to a decoding circuitry. Typically, a decoder is used to perform maximum likelihood decoding of the convolutionally encoded data. For optimal performance, the decoder requires that the input signal (or soft decision samples) meet certain conditions. Specifically, it can be shown that the decoder operates at or near optimum when the input signal to the decoder is scaled by the total noise in the signal band. However, when the filter before the ADC is not matched to signal bandwidth, the signal provided to the decoder is less than optimal and the decoding performance degrades.

SUMMARY OF THE INVENTION

The invention provides techniques that can be used for improved decoding performance of a multi-carrier signal. In accordance with the invention, the multi-carrier signal is initially filtered by an analog filter having a bandwidth that is equal to or wider than the bandwidth of the signal or signals being demodulated and decoded. The analog filter may thus be wider than that of a matched filter. The filtered signal is then sampled (i.e., by an ADC). For each signal being processed, the samples are then filtered with a discrete time matched filter, scaled, quantized, and provided to the decoder. An AGC loop is used to maintain a proper signal level into the quantizer. Thus, matched filtering and gain control are performed after the initial sampling stage.

An embodiment of the invention provides a method for processing a desired signal for decoding (i.e., by a decoder). In accordance with the method, an input signal that includes the desired signal and additional signals is received and filtered with a first filter having a bandwidth greater than a bandwidth of the desired signal. The filtered signal is then sampled to generate discrete time samples that are further filtered with a discrete time matched filter to generate filtered samples. The filtered samples are then scaled with a scaling factor and quantized. A quantity related to the amplitude of the quantized samples (i.e., power) is measured, and the scaling factor is adjusted in accordance with the measured quantity. The quantized samples can be further processed (i.e., demodulated) and provided to a decoder. The desired signal can be a quadrature-modulated signal, in which case matched filtering, scaling, quantization are performed on the in-phase and quadrature components of the desired signal.

The adjustment of the scaling factor can be performed by an automatic gain control (AGC) loop that compares the measured quantity (e.g., the signal power of the quantized samples) against a predetermined value to generate error values. The AGC loop then filters the error values to generate the scaling factor. In an embodiment, the loop filtering can be performed using an accumulator.

Another embodiment of the invention provides a method for processing a multi-carrier signal for decoding. The multi-carrier signal includes two or more spread spectrum signals. In accordance with the method, the multi-carrier signal is filtered with a first filter having a bandwidth greater than a bandwidth of any one of the spread spectrum signals. The filtered signal is then sampled to generate discrete time samples. One or more of the spread spectrum signals received through the first filter is then processed. The processing of each spread spectrum signal includes filtering the discrete time samples with a discrete time filter to provide filtered samples. The discrete time filter has a bandwidth that is matched to a bandwidth of the particular spread spectrum signal being processed. The filtered samples are then scaled with a scaling factor, and the scaled samples are quantized. A quantity related to the amplitude of the quantized samples (i.e., power) is measured, and the scaling factor is adjusted in accordance with the measured quantity. The scaling factor can be adjusted by an AGC loop that compares the measured quantity to an AGC set value to generate error values, and filters the error values to generate the scaling factor. Again, quadrature processing can be performed if the spread spectrum signals are quadrature-modulated signals.

Yet another embodiment of the invention provides a receiver for processing a desired signal in preparation for decoding. The receiver includes an analog filter, a sampler, a matched filter, a scaler, a quantizer, and a gain control circuit. The analog filter receives an input signal that includes the desired signal and additional signals. The analog filter has a bandwidth greater than the bandwidth of the desired signal, and is used for anti-aliasing. The sampler couples to the analog filter and is configured to sample the filtered signal to provide discrete time samples. The matched filter couples to the sampler and is configured to provide matched filtering of the discrete time samples. The scaler couples to the matched filter and is configured to scale the filtered samples with a scaling factor to provide scaled samples. The quantizer couples to the scaler and is configured to quantize the scaled samples to provide quantized samples having a predetermined number of bits of resolution. The gain control circuit couples to the scaler and the quantizer, and is configured to receive the quantized samples from the quantizer and generate the scaling factor for the scaler.

The gain control circuit can be implemented with a detector and a loop filter. The detector couples to the quantizer and is configured to detect a quantity related to the amplitude of the quantized samples to generate data indicative of the detected quantity. The loop filter couples to the detector and is configured to receive the data and to adjust the scaling factor in accordance with the data.

For a further understanding of the nature and advantages of the invention, reference should be made to the ensuing detailed description taken in conjunction with the accompanying drawings.

DESCRIPTION OF THE SPECIFIC EMBODIMENTS

Figure 1:
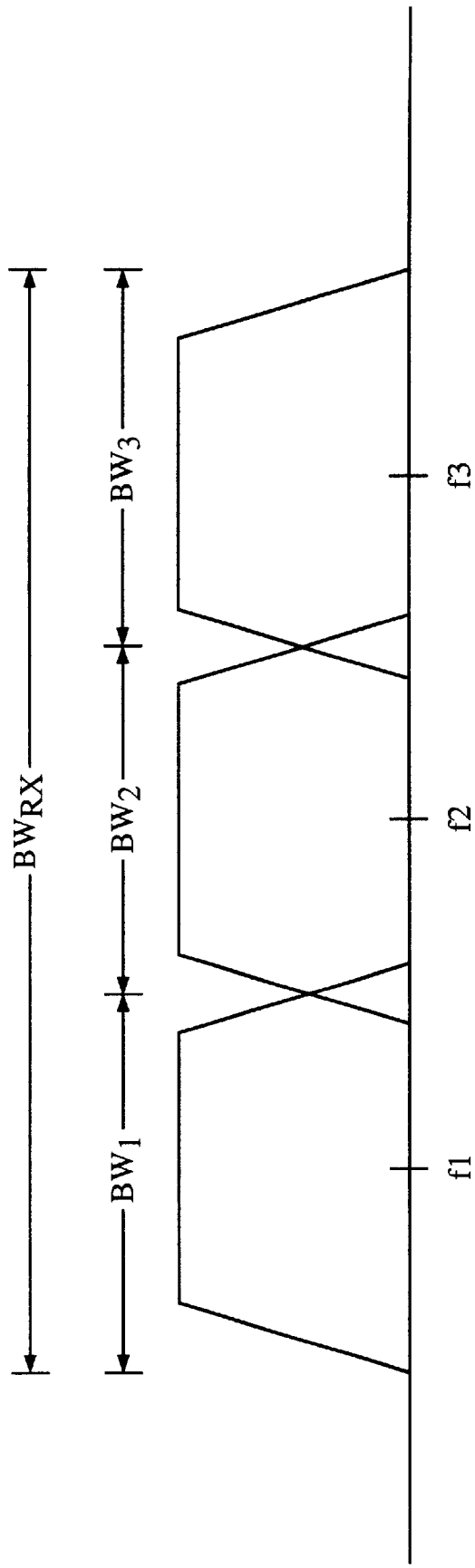
FIG. 1 shows a plot of a multi-carrier (MC) signal that includes three modulated signals.

FIG. 1 shows a plot of a multi-carrier (MC) signal that includes three modulated signals centered at the frequencies of $f_1$, $f_2$, and $f_3$ and occupying predetermined bandwidths of $BW_1$, $BW_2$, and $BW_3$, respectively. The three modulated signals occupy a total bandwidth of $BW_{RX}$. Each modulated signal is generated with its own carrier signal, and the modulated signal is thus also referred to as a "sub-carrier" of the multi-carrier signal. The data in the three modulated signals can be from multiple transmission sources, or from a single source. Three modulated signals may be used, for example, to increase the data transmission capacity of the communications system.

In an embodiment, the multi-carrier signal corresponds to a transmitted signal in a multi-carrier mode defined by the IS-95-C standard. In this embodiment, each modulated signal corresponds to a CDMA spread spectrum signal having a bandwidth of approximately 1.26 MHz. For ease of implementation, the CDMA signals can be equally spaced in frequency (i.e., $\Delta f = f_3 - f_2 = f_2 - f_1$). For efficient utilization of the available signal spectrum, the CDMA signals can be spaced by approximately the signal bandwidth, or $\Delta f \approx BW$, where BW is the bandwidth of one CDMA signal.

Figure 2:
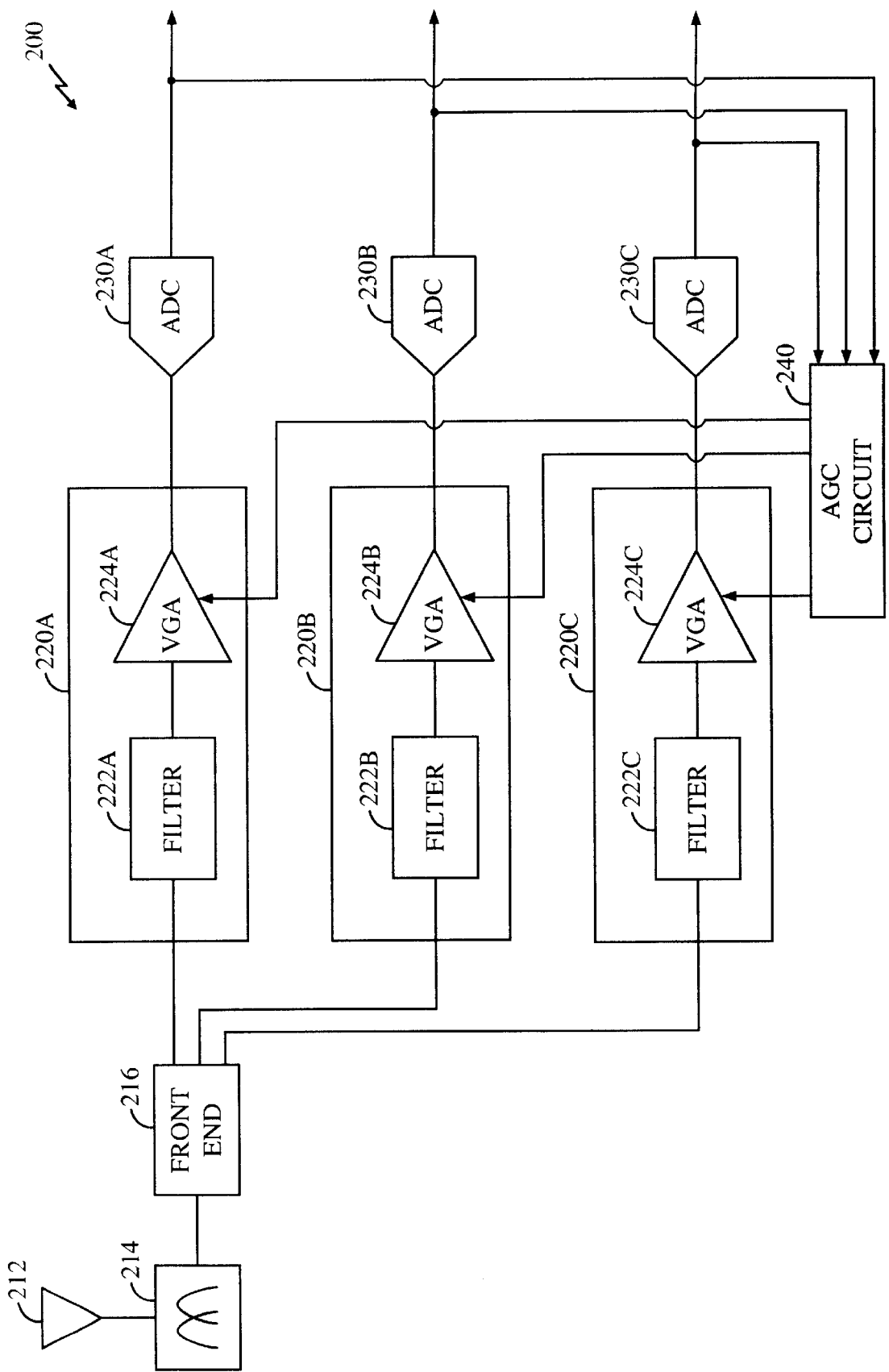
FIG. 2 shows a simplified block diagram of an embodiment of a receiver for processing the multi-carrier signal shown in FIG. 1.

FIG. 2 shows a simplified block diagram of an embodiment of a receiver 200 for processing the multi-carrier signal shown in FIG. 1. The transmitted signal is received by an antenna 212, routed through a duplexer 214, and provided to a front-end unit 216. Front-end unit 216 conditions, filters, and downconverts the received signal and provides the processed signals (i.e., at the proper downconverted frequencies) to matched filter units 220a, 220b, and 220c. Each matched filter unit 220 includes a matched filter 222 coupled in series with a variable gain amplifier (VGA) 224. Filter 222 provides matched filtering for one modulated signal, and has a bandwidth matched to the bandwidth of the particular signal on which it operates. VGA 224 provides adjustable gain of the filtered signal and is controlled by a gain control signal from an AGC circuit 240. The amplified signal from each VGA 224 is provided to a respective ADC 230 that quantizes the signal to generate quantized data samples. The quantized data samples are further demodulated and decoded (not shown in FIG. 2). The quantized data samples are also provided to AGC circuit 240.

The receiver architecture shown in FIG. 2 includes several disadvantages. First, this receiver architecture uses three analog matched filters and three gain control loops. Typically, analog filters are more expensive to implement, require additional board area, increase circuit complexity, and reduce circuit reliability than discrete time filters. Fixed bandwidth analog filters are also inflexible, and cannot be used as matched filters for signals of varying bandwidths. Second, this receiver architecture uses three ADCs (or three pairs of ADCs for digital quadrature demodulation), which is three times the number of ADCs for a single sub-carrier design.

Figure 3:
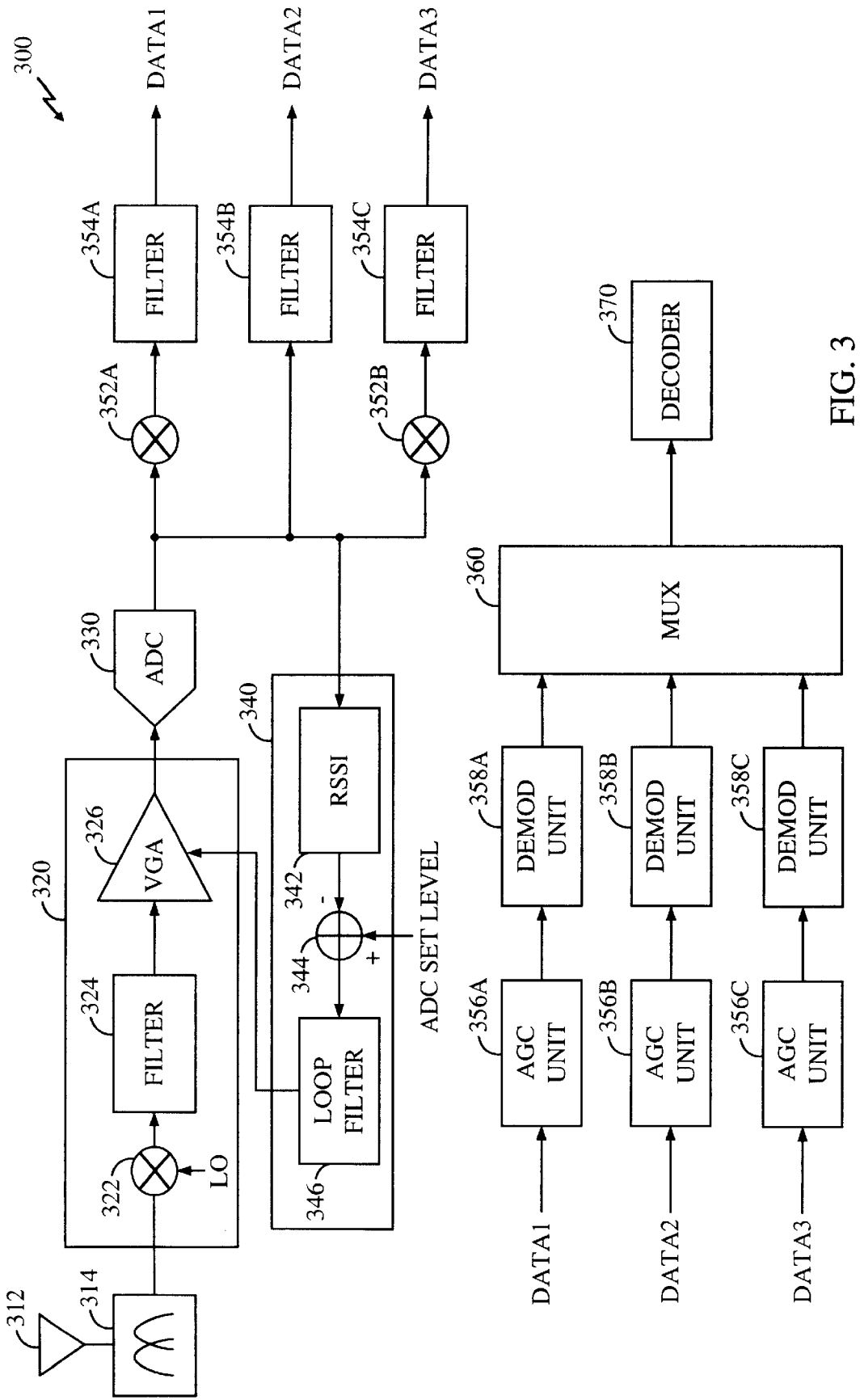
FIG. 3 shows a simplified block diagram of an embodiment of another receiver for processing the multi-carrier signal shown in FIG. 1.

FIG. 3 shows a simplified block diagram of an embodiment of another receiver 300 for processing the multi-carrier signal shown in FIG. 1. The transmitted signal is received by an antenna 312, routed through a duplexer 314, and provided to a front-end unit 320. Front-end unit 320 includes a mixer 322, a filter 324, and a variable gain amplifier (VGA) 326. Mixer 322 downconverts the received signal from radio frequency (RF) to an intermediate frequency (IF) or to baseband. Filter 324 filters the downconverted signal and VGA 326 amplifies the filtered signal.

In FIG. 3, mixer 322 is representative of all frequency conversion stages in the received signal path from the antenna to the analog-to-digital converter (ADC), filter 324 is representative of the total filtering in the received signal path, and VGA 326 is representative of the total (and variable) gain in the received signal path. In most receiver designs, multiple stages of frequency downconversion, filtering, and amplification are typically provided. Filtering and low noise amplification are usually performed before frequency downconversion. Filter 324 has a bandwidth related to the bandwidth of the signal being demodulated. In a specific embodiment, for the multi-carrier signal shown in FIG. 1, filter 324 has a bandwidth matched to the bandwidth of the multi-carrier signal or $BW_{RX}$. However, a filter having a wider bandwidth can also be used.

Front-end 320 can be implemented with various designs. The frequency downconversion, filtering, and amplification can be distributed in various manner throughout the received signal path. Filter 324 can be centered at baseband or at IF. A specific design of front end 320 is disclosed in U.S. patent application Ser. No. 08/987,306, entitled Receiver with Sigma Delta Analog to Digital Converter, filed Dec. 9, 1997 and U.S. patent application Ser. No. 08/987,305 entitled Programmable Linear Receiver, filed Dec. 9, 1997 all assigned to the assignee of the present invention and incorporated herein by reference.

The amplified signal from front-end 320 is provided to an ADC 330 that samples the signal to generate discrete time data samples. The discrete time data samples are provided to an AGC circuit 340, mixers 352a and 352b, and a filter 354b.

For clarity, only one ADC 330 is shown in FIG. 3. For many digital modulation formats such as QPSK (quadrature phase shift keying), OQPSK (offset quadrature phase shift keying), and PSK (phase shift keying), quadrature demodulation is performed. For these modulation formats, the received signal is demodulated into an in-phase component and a quadrature component. In many receiver designs, the quadrature demodulation is performed using analog circuitry to generate the analog baseband I and Q signals that are quantized with separate I and Q ADCs. In other receiver designs, the received signal is quantized at an IF using one bandpass ADC, and quadrature demodulation is performed digitally.

AGC circuit 340 adjusts the gain of VGA 326 to maintain the signal provided to ADC 330 at a proper signal level. This signal level is selected to minimize the amount of quantization plus saturation noise from the ADC. For example, if the signal level is small, larger amounts of quantization noise (relative to the desired signal) are generated. Conversely, if the signal level is large, larger amounts of saturation noise are generated (again relative to the desired signal) because of clipping by the ADC (due to its typically finite dynamic range). The optimal signal level maximizes the signal to total noise ratio. For a CDMA signal, it can be shown that optimal or near optimal performance can be obtained if the root-mean-square (RMS) signal levels of the I and Q baseband signals are each set at ⅜ of full-scale, or ±3 LSBs when using a 4-bit ADC. For an ADC that has large (or infinite) dynamic range, AGC circuit 340 may not be needed.

Within AGC circuit 340, the discrete time data samples are provided to a received signal strength indicator (RSSI) 342 that detects the power of the data samples. For quadrature demodulated signals, the received power level ($I_O$) is related to the power of the samples from the ADCs, which can be computed as $I_O I_{O,ADC} = I_{ADC}^2 + Q_{ADC}^2$, where $I_{ADC}$ is the data samples from the I ADC and $Q_{ADC}$ is the data samples from the Q ADC. The detected power is provided to a summer 344 that compares the detected power to an ADC set level to generate an error signal. The ADC set level determines the signal level provided to ADC 330, and consequently the power of the samples from ADC 330. In a specific embodiment, ADC 330 has four bits of resolution and the ADC set level is set at $I_{O,ADC} = I_{ADC}^2 + Q_{ADC}^2 = 18$ for either a single CDMA signal or a multi-carrier signal comprising three CDMA signals. The error signal from summer 344 is provided to a loop filter 346 that filters the error signal to generate a control signal for VGA 326. In an embodiment, loop filter 346 is implemented as an integrator having a transfer function of $K_A/S$, where $K_A$ is the gain of the integrator. $K_A$ is one of the factors that determine the AGC loop bandwidth.

In an embodiment, for the multi-carrier signal shown in FIG. 1, mixer 322 downconverts the received signal such that the modulated signal centered at $f_2$ is converted down to baseband. The discrete time data samples from ADC 330 then comprises the signal centered at $f_2$ (which has been downconverted to baseband), the modulated signal centered at $f_1$ (which has been downconverted to $-\Delta f$. and the modulated signal centered at $f_2$ (which has been downconverted to $+\Delta f$). The modulated signals centered $-\Delta f$ and $+\Delta f$ at are further downconverted to baseband by mixers 352a and 352b in a subsequent digital downconversion step. For example, mixers 352a and 352b can downconvert the data samples centered at $-\Delta f$ and $+\Delta f$, respectively, to baseband using digital derotation. The baseband data samples from mixers 352a and 352b are then provided to filters 354a and 354c, respectively.

Filters 354a, 354b, and 354c are matched filters having bandwidths matched to the bandwidth of their respective input signals. For example, filter 354a is matched to the first modulated signal originally centered at $f_1$, filter 354b is matched to the second modulated signal originally centered at $f_2$, and filter 354c is matched to the third modulated signal originally centered at $f_3$. Filters 354 can be implemented as a finite impulse response filter (FIR), an infinite impulse response filter (IIR), a polyphase filter, or other filter topologies known in the art. The filtered data samples may also be decimated to reduce the sample rate. For quadrature demodulation, each of filters 354a, 354b, and 354c includes one filter for the I data samples and another filter for the Q data samples.

The filtered samples from filters 354a through 354c are provided to AGC units 356a through 356c, respectively, that rescale and quantize the data samples for improved decoding performance. The quantized data samples from AGC units 356a through 356c are provided to demodulator units 358a through 358c, respectively, that demodulate the data samples. AGC units 356 and demodulator units 358 are described in further detail below. The demodulated samples are multiplexed through a multiplexer (MUX) 360 and provided to a decoder 370 that decodes the samples. In an embodiment, decoder 370 includes a decoder.

Figure 4:
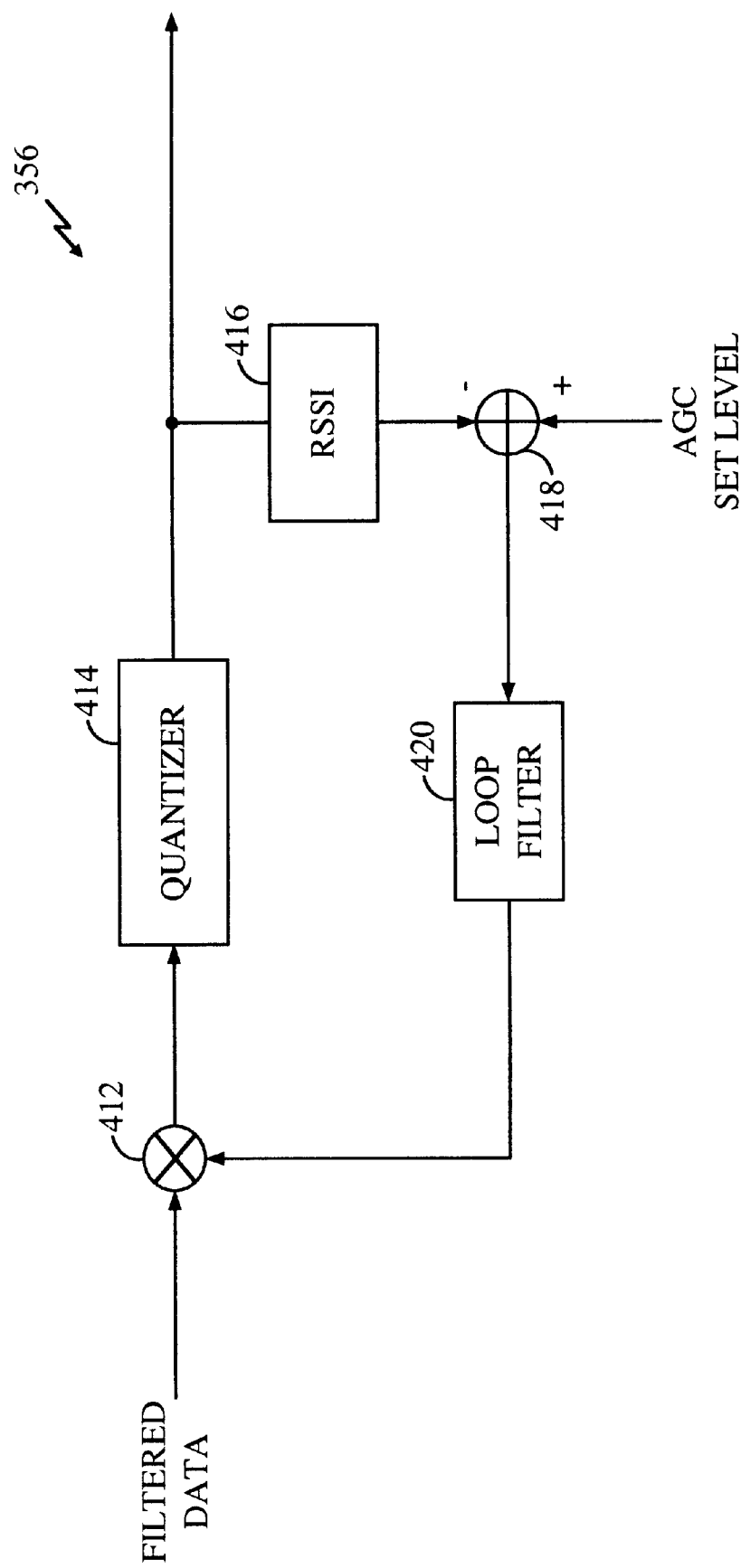
FIG. 4 shows a diagram of an embodiment of an AGC unit.

FIG. 4 shows a diagram of an embodiment of one AGC unit 356 for one signal path (i.e., one modulated signal to be processed and decoded). The filtered data samples are provided to a scaler 412 that scales the data samples with a scaling coefficient provided from a loop filter 420. The scaled data samples are provided to a quantizer 414 that quantizes the data samples and rounds the quantized samples. In a specific embodiment, the filtered data samples have 11 bits of resolution and quantizer 414 rounds each quantized sample to four bits. The output from quantizer 414 comprises the quantized data samples from AGC unit 356.

As shown in FIG. 4, AGC unit 356 includes one scaler 412 and one quantizer 414. For a quadrature demodulator, one set of scaler and quantizer is provided for the I data samples and another set of scaler and quantizer is provided for the Q data samples. The scaling coefficients for the I and Q scalers can be identical. Alternatively, the scaling coefficients can have the same average amplitude but are in quadrature (i.e., to allow for derotation of the filtered data samples).

The quantized data samples (i.e., from both I and Q quantizers) are provided to a RSSI 416 that detects the power of the data samples. For quadrature demodulation, the power for the signal being demodulated is related to the power of the samples from the quantizer, which can be computed as $I_{OQi}=I_{Qi}^2+Q_{Qi}^2$, where $I_{Qi}$, is the quantized data samples from the I quantizer in the i-th signal path, and $Q_{Qi}$ is the quantized data samples from the Q quantizer in the i-th signal path. The detected power from the quantizer ($I_{OQi}$) is provided to a summer 418 that compares the detected power to an AGC set level for the particular signal being processed. The AGC set level determines the power (and the signal level) of the quantized data samples provided to decoder 370. In a specific embodiment, the AGC set level is set to $I_{OQi}=18$ for a CDMA signal. Summer 418 generates an error signal that is provided to a loop filter 420. Loop filter 420 filters the error signal to generate the scaling coefficient for scaler 412. In an embodiment, loop filter 420 is implemented as an integrator having a transfer function of $K_{Bi}/S$, where $K_{Bi}$ is the gain of the integrator in the i-th signal path. In this embodiment, the integrator can be implemented with an accumulator.

Figure 5:
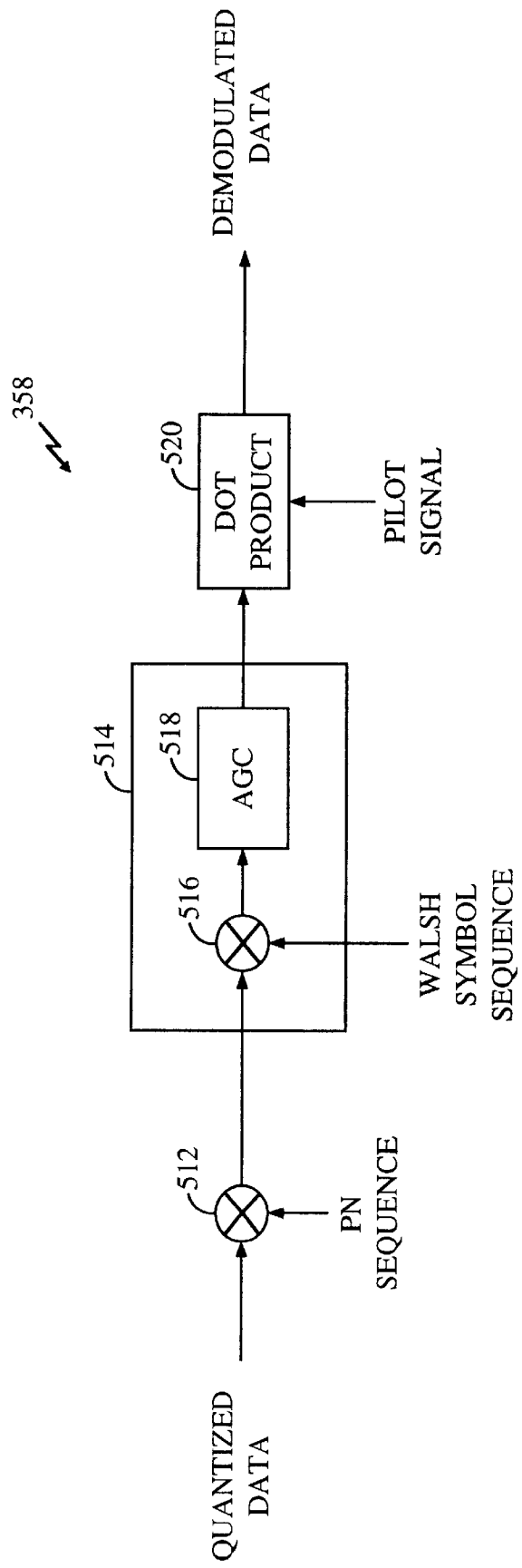
FIG. 5 shows a diagram of an embodiment of a demodulation unit for CDMA signal.

FIG. 5 shows a diagram of an embodiment of demodulation unit 358 for a CDMA signal. The quantized data samples from each AGC unit 356 are provided to a respective demodulation unit 358. For a CDMA signal, within demodulation unit 358, the quantized data samples are provided to a multiplier 512 that despreads the samples with a PN sequence matching the PN sequence used at the transmitter for that particular CDMA signal. The despread samples are provided to a decoverer 514 that decovers the samples with a Walsh code corresponding to the channel being demodulated. Specifically, within decover 514, the despread samples are provided to a multiplier 516 that multiplies the samples with a Walsh symbol sequence corresponding to the Walsh code of the channel being demodulated. The resultant products from multiplier 516 are provided to an accumulator (ACC) 518 that sums the products over the length of the Walsh symbol sequence (e.g., 64 symbols for CDMA). The decovered samples are provided to a dot product circuit 520 that performs a dot product of the samples with the recovered pilot signal to perform coherent demodulation.

CDMA receivers typically employ a carrier-tracking loop to track the pilot (or carrier) signal for the CDMA signal being demodulated. The recovered pilot signal includes information on the signal strength of the received signal. The recovered pilot signal also includes phase information that is used (by the dot product) for coherent detection. The PN despreading, Walsh decovering, and coherent demodulation are further described in U.S. Pat. No. 5,103,459, entitled "System and Method for Generating Signal Waveforms in a CDMA Cellular Telephone System", issued Apr. 7, 1992, and incorporated herein by reference.

Referring to FIG. 3, the power of the data samples from ADC 330 is set by AGC circuit 340 to a predetermined power level or $I_{OADC}=\beta$. For the multi-carrier signal shown in FIG. 1, the three modulated signals have power of $I_{O1}$, $I_{O2}$, and $I_{O3}$. $I_O$ represents the total signal plus noise power within the bandwidth of filter 324. Similarly, $I_{O1}$, $I_{O2}$, and $I_{O3}$ represent the total signal plus noise power within the bandwidth of filters 354a, 354b, and 354c, respectively. Typically, the following approximation can be made:

$$I_O = I_{O1} + I_{O2} + I_{O3}.$$

A decoder performs a maximum-likelihood decoding of the received data samples. From the maximum-likelihood principle, the hypothesis that minimizes the probability of error solves the following equation:

$$m: pdf(x|m) = \max_l \{pdf(x|l)\}, \qquad \text{Eq (1)}$$

where m is the vector corresponding to one hypothesis of the transmitted encoded bits and x is the received soft-decisions (i.e., the 4-bit data samples provided to the decoder). If, at time n, it is assumed that the expected value of x, or $E[x_n]$, is $\mu_n$ given a '0' was transmitted (and $-\mu_n$ given a '1' was transmitted) and that the noise on $x_n$ is additive white Gaussian noise (AWGN) with a standard deviation of $\sigma_n$, then the following can be shown:

$$pdf(x|m) = \prod_n \frac{1}{\sqrt{2\pi}\,\sigma_n} e^{\frac{-(x_n - a_{n,m}\mu_n)^2}{2\sigma_n^2}}, \qquad \text{Eq (2)}$$

where $a_{n,m}$ is the n-th element of hypothesis m and has a value of either +1 or −1.

Equations (1) and (2) can be combined to solve for the equivalent solution for the maximum-likelihood hypothesis as:

$$m : \sum_n \frac{a_{n,m}\mu_n x_n}{\sigma_n^2} = \max_l \left\{ \sum_n \frac{a_{n,l}\mu_n x_n}{\sigma_n^2} \right\}. \quad \text{Eq (3)}$$

In equation (3), $\mu_n x_n$ represents the power of the desired signal and $\sigma_n^2$ represents the power of the noise within the desired signal band. The maximum-likelihood principle and the derivations of the above equations are further described in detail by R. Blahut in a book entitled "Digital Transmission of Information," published 1990, pages 170–175, and incorporated herein by reference.

For the receiver implementation shown in FIG. 3, with AGC units 356 bypassed, the terms in equation (3) can be approximated as:

$$\mu_n \approx K_p \sqrt{E_n^p}, \quad \text{Eq (4)}$$

$$x_n \approx K_d \sqrt{E_n^d}, \quad \text{Eq (5)}$$

$$\sigma_n \approx K_\sigma \sqrt{I_O}, \quad \text{Eq (6)}$$

where $E_n^P$ is the value of the pilot signal at time n, $E_n^P$ is the value of the data sample at time n, $I_O$ is the total power received through filter 324, and $K_p$, $K_d$, and $K_\sigma$ are hardware factors. For a CDMA spread spectrum signal, the received signal includes the signals for all Walsh channels.

For CDMA systems, the noise ($\sigma_n^2$) can be approximated as the power of the total inband received signal plus noise, or $I_O$. Substituting the approximations in equations (4) through (6) into equation (3), the decoder solves for the best hypothesis m using the following:

$$m : \sum_n \frac{\left(\pm \sqrt{E_n^p E_n^d}\right) a_{n,m}}{I_O} = \max_l \left\{ \sum_n \frac{\left(\pm \sqrt{E_n^p E_n^d}\right) a_{n,l}}{I_O} \right\}. \quad \text{Eq (7)}$$

In equation (7), the multiplication of the expected pilot signal ($E_n^P$) and expected data sample ($E_n^P$) under the square root is performed by dot product 520 within demodulation unit 356. The sign in front of the square root is determined by the sign after the dot product. And the division by $I_O$ is achieved by AGC circuit 340. Equation (7) represents the hypothesis solved by the decoder without AGC unit 356.

In equation (7), the quantity under the square root is indicative of the desired signal being demodulated. For both single carrier and multi-carrier modes, the dot product to derive the quantity under the square root is formed using the energies obtained from within the desired modulated signal (or sub-carrier). However, as noted in equation (7), without AGC unit 356, the signal provided to the decoder is scaled by the total power ($I_O$) provided from the ADC. For a multi-carrier signal, $I_O$ includes the total power of the signal plus noise from all three modulated signals.

As noted above in equation (3), for improved decoding performance, the data samples provided to the decoder should be scaled by only the noise power within desired signal band (or $I_{Oi}$, where i is the particular modulated signal being decoded and has a value of i=1, 2, or 3). The noise power for each modulated signal ($I_{O1}$, $I_{O2}$, or $I_{O3}$) can be approximated as the total noise ($I_O$) times a scaling factor ($K_o^2$). $K_o^2$ may be determined based on the bandwidth of the particular signal being decoded ($BW_1$, $BW_2$, $BW_3$), the bandwidth of the total multi-carrier signal ($BW_{RX}$), and the characteristics of the spectrum. For the multi-carrier signal shown in FIG. 1, where the three modulated signals have equal bandwidths and the same received power level, the noise power for each modulated signal can be approximated as ⅓ of the total measured noise power, or $I_{Oi}=I_O/3$.

Estimating the noise power in the desired signal band by scaling the total noise power by three is not accurate in many circumstances. For example, the three modulated signals can be transmitted and received at different power levels (i.e., $I_{O1} \neq I_{O2} \neq I_{O3}$). Moreover, each modulated signal may also be loaded differently (i.e., ten calls in one CDMA signal and one call in another CDMA signal). In addition, the multi-carrier signal may experience a Rayleigh fade that attenuates signals at different frequencies by different amounts. For these and other reasons, the noise power ($\sigma_n^2$) on bit $x_n$ cannot be accurately approximated as $K_o^2 I_O$ since $I_O$ is the total power for all three modulated signals whereas the energy of bit $x_n$ is derived from only one modulated signal.

A better approximation for the noise's standard deviation ($\sigma_{ni}$) on bit $x_{ni}$ is the total power in the modulated signal from which bit $x_{ni}$ was extracted, or $$\sigma_{ni} \approx \sqrt{I_{Oi}}, \quad \text{Eq (8)}$$

The approximation in equation (8) provides for improved decoding performance. To achieve this approximation, an AGC unit is used to properly scale the filtered data samples by the approximated noise power for the particular modulated signal being decoded.

Referring back to FIG. 3, AGC circuit 340 adjusts the level of the signal (i.e., multi-carrier) provided to ADC 330 to minimize quantization and saturation noise. The power level from ADC 330 is scaled by the total power of the multi-carrier signal, or $I_O$. Filter 354 performs matched filtering of the data samples from ADC 330 to provide only (or predominantly) the signal and noise within the desired signal band. The out-of-band signal and noise from other modulated signals are filtered out.

Referring to FIG. 4, AGC unit 356 scales the filtered data samples with a scaling coefficient, quantizes the scaled data samples, and adjusts the scaling coefficient such that the power of the quantized data samples is set to a particular AGC set level or set point (e.g., $I_{Oi}$=AGC set point). Thus, the quantized data samples from AGC unit 356 are effectively scaled by a scaling factor of (1/$I_{Oi}$).

The receiver architecture in FIG. 3 performs sampling, discrete-time matched filtering, and discrete-time AGC to generate the data samples for the decoder. The sampling is performed by ADC 330. Care is used to ensure that the signal level of the signal provided to ADC 330 is not set too low (resulting in excessive quantization noise) or set too high (resulting in excessive saturation noise). The proper signal level can be determined by system simulation or by empirical measurements.

The discrete-time matched filtering is performed by filter 354. The discrete-time automatic gain control by AGC unit 356 includes scaling and quantization to provide the decoder with data samples at the proper signal level and having the required number of bits. In the receiver architecture shown in FIG. 3, demodulation unit 358 provides a predetermined signal gain. Accordingly, the data gain of AGC unit 356 is set such that, with the predetermined gain from demodulation unit, data samples are provided to the decoder at the proper level.

Various modifications can be made to the specific receiver architecture shown in FIG. 3. In one design, ADC 330 can be configured to perform bandpass sampling of the received signal. In this design, for each signal being demodulated, the bandpass data samples are provided to a pair of I and Q mixers that perform digital quadrature downconversion. In this design, the matched filters can be located before or after the digital downconversion, and are implemented as bandpass filters if located before the digital downconversion and as lowpass filters if located after the digital downconversion. If the matched filters are located before the digital downconversion, the mixer can be combined with (or performed by) the scaler within AGC unit 356. The scaling factors provided to the scaler would then providing both scaling and derotation of the data samples. Other receiver designs or modifications are possible and are within the scope of the invention.

The invention can used for any modulation format, including digital modulation formats (e.g., QPSK, FSK, PSK, and other), analog modulation formats (e.g., AM and FM), and others. For example, each of the modulated signals in FIG. 1 can comprise a CDMA spread spectrum signal. However, the modulated signals can also be modulated using different modulation formats. For clarity, the invention has been described in the context of CDMA signals.

The invention has been described in the context of adjustment of the signal level for improved decoding performance. However, the invention can be used to adjust the signal level for any process that requires a particular signal level, such as (multi-level) demodulation, signal detection, and so on. The invention is thus not limited for use only with a decoder.

The signal processing described above can be implemented in various manners. For example, the processing can be performed by an application specific integrated circuit (ASIC), a digital signal processor (DSP), a controller, a microprocessor, or other circuits designed to perform the functions described herein. Moreover, the signal processing can be performed by software codes executed on a processor, or a combination of hardware and software codes.

The foregoing description of the specific embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for processing a multi-carrier signal for decoding, wherein the multi-carrier signal includes two or more spread spectrum signals, the method comprising:

filtering the multi-carrier signal with a first filter having a bandwidth greater than a bandwidth of any one of the spread spectrum signals;

quantizing the filtered signal to generate discrete time samples; and processing one or more of the spread spectrum signals received through the first filter, wherein the processing of each spread spectrum signal includes filtering the discrete time samples with a discrete time filter to provide filtered samples, wherein the discrete time filter has a bandwidth matched to a bandwidth of the particular spread spectrum signal being processed, scaling the filtered samples with a scaling factor, quantizing the scaled samples, measuring a quantity related to an amplitude of the quantized samples, and adjusting the scaling factor in accordance with the measured quantity.

2. The method of claim 1 wherein the adjusting is performed by an automatic gain control (AGC) loop, the AGC loop comparing the measured quantity to an AGC set value to generate error values, the AGC loop then filtering the error values to generate the scaling factor.

3. The method of claim 1 wherein spread spectrum signals are quadrature modulated signals, and wherein the filtering, scaling, quantizing, and measuring are performed on an in-phase component and a quadrature component of each spread spectrum signal being processed.

4. The method of claim 1 wherein the processing further includes:

decoding the quantized samples with a decoder.

5. The method of claim 4, further comprising demodulating the quantized samples.

6. The method of claim 4, wherein the measured quantity is determined by computing a power of the quantized samples.

7. The method of claim 4, wherein the amplitude of the quantized samples is set for improved decoding performance.

8. The method of claim 1, wherein the adjusting includes:

comparing the measured quantity against a predetermined value to generate error values; and generating the scaling factor based on the error values.

9. The method of claim 8, wherein the generating includes filtering the error values, the scaling factor being generated based on the filtered error values.

10. The method of claim 9, wherein the filtering the error values is performed with an integrator.

11. The method of claim 1 wherein the quantized samples have a resolution of four bits.

12. The method of claim 1, wherein the scaling factor is adjusted such that an average power of the quantized samples is maintained at a predetermined level.

13. The method of claim 1, wherein the multi-carrier signal is a CDMA signal.

14. The method of claim 1, wherein the multi-carrier signal is a quadrature modulated signal.

15. The method of claim 14, wherein the filtering the discrete time samples is performed with a set of discrete time matched filters, one matched filter for an in-phase component of the desired signal and another matched filter for a quadrature component of the desired signal.

16. The method of claim 15, wherein the scaling is performed with pairs of scaling factors, one scaling factor for the filtered samples from the matched filter for the in-phase component and another scaling factor for the filtered samples from the matched filter for the quadrature component.

17. The method of claim 16, wherein each pair of scaling factors includes scaling factors that are in quadrature to allow for denotation of the filtered samples.

18. The method of claim 1, wherein the scaling factor is adjusted to reduce saturation and quantization noise in the quantized samples.

19. The method of claim 1, further comprising:

decimating the filtered samples by a decimation factor.

20. The method of claim 1, wherein at least two of the spread spectrum signals have a bandwidth that is similar.

21. A device for processing a multi-carrier signal for decoding, wherein the multi-carrier signal includes two or more spread spectrum signals, the device comprising:

a first filter for filtering the multi-carrier signal and having a bandwidth greater than a bandwidth of any one of the spread spectrum signals;

a sampler for sampling the filtered signal to generate discrete time samples; and means for processing one or more of the spread spectrum signals received through the first filter, wherein the processing of each spread spectrum signal includes a discrete time filter for filtering the discrete time samples to provide filtered samples, wherein the discrete time filter has a bandwidth matched to a bandwidth of the particular spread spectrum signal being processed, a scaler for scaling the filtered samples with a scaling factor, a quantizer for quantizing the scaled samples, and a gain control circuit to measure a quantity related to an amplitude of the quantized samples and to adjust the scaling factor in accordance with the measured quantity.

22. The device of claim 21, wherein the gain control circuit is an automatic gain control (AGC) loop, the AGC loop comparing the measured quantity to an AGC set value to generate error values, the AGC loop then filtering the error values to generate the scaling factor.

23. The device of claim 21, wherein spread spectrum signals are quadrature modulated signals, and wherein the filtering, scaling quantizing, and measuring are performed on an in-phase component and a quadrature component of each spread spectrum signal being processed.

24. The device of claim 21, wherein the means for processing further includes a decoder coupled to the quantizer for decoding the quantized samples.

25. The device of claim 21, further comprising:

a demodulator coupled to the quantizer; and a decoder coupled to the demodulator.

26. The device of claim 21, wherein the gain control circuit includes:

a detector coupled to die quantizer, the detector configured to detect a quantity related to an amplitude of the quantized samples and to provide data indicative of the detected quantity; and a loop filter coupled to the detector, the loop filter configured to receive the data and adjust the scaling factor in accordance with the data.

27. The device of claim 26, wherein the loop filter includes:

a summer configured to receive the data and a set value and to generate error values; and a filter coupled to the summer, the filter configured to filter the error values to generate the scaling factor.

28. The device of claim 27, wherein the filter within the loop filter is implemented with an accumulator.

29. The device of claim 21, wherein the device is a receiver.

30. A CDMA receiver for processing a multi-carrier signal for decoding, wherein the multi-carrier signal includes two or more spread spectrum signals, the CDMA receiver comprising:

a first filter for filtering the multi-carrier signal and having a bandwidth greater than a bandwidth of any one of the spread spectrum signals;

a sampler for sampling the filtered signal to generate discrete time samples; and means for processing one or more of the spread spectrum signals received through the first filter, wherein the processing of each spread spectrum signal includes:

a discrete time filter for filtering the discrete time samples to provide filtered samples, wherein the discrete time filter has a bandwidth matched to a bandwidth of the particular spread spectrum signal being processed, a scaler for scaling the filtered samples with a scaling factor, a quantizer for quantizing the scaled samples, and a gain control circuit to measure a quantity related to an amplitude of the quantized samples and to adjust the scaling factor in accordance with the measured quantity.

* * * * *